(12) United States Patent
Samardzija et al.

(10) Patent No.: US 11,011,847 B2
(45) Date of Patent: May 18, 2021

(54) MULTI-ANTENNA STRUCTURE WITH TWO RADIATING ANTENNAS WITH ONE ANTENNA FED FROM THE OTHER ANTENNA

(71) Applicant: Plume Design, Inc., Palo Alto, CA (US)

(72) Inventors: Miroslav Samardzija, Mountain View, CA (US); William McFarland, Portola Valley, CA (US); Brian Nam, San Jose, CA (US); Liem Hieu Dinh Vo, San Jose, CA (US)

(73) Assignee: Plume Design, Inc., Palo Alto, CA (US)

( * ) Notice: Subject to any disclaimer, the term of this patent is extended or adjusted under 35 U.S.C. 154(b) by 103 days.

(21) Appl. No.: 16/408,523

(22) Filed: May 10, 2019

(65) Prior Publication Data

US 2020/0358196 A1 Nov. 12, 2020

(51) Int. Cl.
*H01Q 9/30* (2006.01)
*H01Q 5/40* (2015.01)
*H01Q 13/10* (2006.01)
*H01Q 7/00* (2006.01)
*H01Q 13/18* (2006.01)
*H01Q 1/22* (2006.01)
*H01Q 1/44* (2006.01)
*H01Q 5/371* (2015.01)
(Continued)

(52) U.S. Cl.
CPC .............. *H01Q 9/30* (2013.01); *H01L 23/36* (2013.01); *H01Q 1/2291* (2013.01); *H01Q 1/44* (2013.01); *H01Q 5/371* (2015.01); *H01Q 5/392* (2015.01); *H01Q 5/40* (2015.01); *H01Q 7/00* (2013.01); *H01Q 13/18* (2013.01)

(58) Field of Classification Search
CPC .. H01Q 9/30; H01Q 9/04; H01Q 9/26; H01Q 9/40; H01Q 1/44; H01Q 5/30; H01Q 5/371; H01Q 5/378; H01Q 5/392; H01Q 5/40; H01Q 7/00; H01Q 13/10; H01Q 13/18; H01Q 1/2291; H01L 23/36
See application file for complete search history.

(56) References Cited

U.S. PATENT DOCUMENTS 6,853,197 B1 2/2005 McFarland et al.
6,961,545 B2 11/2005 Tehrani et al.
(Continued)

*Primary Examiner* — Thai Pham
(74) *Attorney, Agent, or Firm* — Clements Bernard Walker; Lawrence A. Baratta, Jr.

(57) ABSTRACT

A multi-antenna structure includes a monopole-like or loop-like antenna structure with an antenna feed configured to connect to electrical circuitry; and a slot-like antenna structure adjacent to the monopole-like or loop-like antenna structure and capacitively fed by the monopole-like or loop-like antenna structure, wherein the monopole-like or loop-like antenna structure and the slot-like antenna structure operate as a combined antenna with extended bandwidth relative to operation individually. The monopole-like or loop-like antenna structure can include a horizontal member and a plurality of vertical members connected to the horizontal member. The slot-like antenna structure can include two parallel horizontal members separated by a slot and a vertical member at one end of the slot connected to each of the two parallel horizontal members separated and another end of the slot is open.

20 Claims, 8 Drawing Sheets

(51) Int. Cl.
*H01Q 5/392* (2015.01)
*H01L 23/36* (2006.01)

(56) References Cited

U.S. PATENT DOCUMENTS

| | | | |
|---|---|---|---|
| 7,245,882 B1 | 7/2007 | McFarland | |
| 7,245,893 B1 | 7/2007 | Husted et al. | |
| 7,251,459 B2 | 7/2007 | McFarland et al. | |
| 7,460,069 B2 * | 12/2008 | Park | H01Q 9/42 343/700 MS |
| 9,136,937 B1 | 9/2015 | Cheng et al. | |
| 9,160,584 B1 | 10/2015 | Kavousian et al. | |
| 9,502,772 B2 * | 11/2016 | Chen | H01Q 5/378 |
| 9,673,512 B2 * | 6/2017 | Lin | H01Q 9/42 |
| 2010/0073241 A1 * | 3/2010 | Ayala Vazquez | H01Q 1/2266 343/702 |
| 2010/0309068 A1 * | 12/2010 | Duron | H01Q 9/285 343/730 |
| 2012/0176292 A1 * | 7/2012 | Hung | H01Q 1/243 343/846 |
| 2012/0313834 A1 * | 12/2012 | Eom | H01Q 7/00 343/787 |
| 2012/0326936 A1 * | 12/2012 | Tu | H01Q 13/10 343/767 |
| 2013/0090057 A1 | 4/2013 | Green et al. | |
| 2013/0214986 A1 * | 8/2013 | Zhu | H01Q 1/243 343/848 |
| 2013/0293424 A1 | 11/2013 | Zhu et al. | |
| 2014/0009344 A1 | 1/2014 | Zhu et al. | |
| 2014/0009355 A1 | 1/2014 | Samardzija et al. | |
| 2014/0112511 A1 | 4/2014 | Corbin et al. | |
| 2014/0226572 A1 | 8/2014 | Thota et al. | |
| 2014/0340265 A1 | 11/2014 | Vazquez et al. | |
| 2015/0099474 A1 | 4/2015 | Yarga et al. | |
| 2015/0109167 A1 | 4/2015 | Yarga et al. | |
| 2015/0195836 A1 | 7/2015 | Malkin et al. | |
| 2015/0302976 A1 | 10/2015 | Chang et al. | |
| 2015/0303568 A1 | 10/2015 | Yarga et al. | |
| 2015/0311960 A1 | 10/2015 | Samardzija et al. | |
| 2016/0056526 A1 | 2/2016 | Li et al. | |
| 2016/0336643 A1 | 11/2016 | Pascolini et al. | |
| 2017/0005414 A1 * | 1/2017 | Yang | H01Q 5/378 |

* cited by examiner

MULTI-ANTENNA STRUCTURE WITH TWO RADIATING ANTENNAS WITH ONE ANTENNA FED FROM THE OTHER ANTENNA

FIELD OF THE DISCLOSURE

The present disclosure generally relates to antennas. More particularly, the present disclosure relates to systems and methods for a multi-antenna structure with two radiating antennas where one antenna is fed from the other antenna.

BACKGROUND OF THE DISCLOSURE

Various devices utilize antennas for wireless communication, such as wireless Access Points (APs), streaming media devices, laptops, tablets, and the like (collectively "wireless devices"). Further, the design trend for such devices is aesthetically pleasing and compact form factors. One particular disadvantage of a compact form factor is antennas have less space and tighter tolerances which can be problematic in mass production. Another disadvantage of the aesthetically pleasing and compact form factors in such hardware devices includes parasitics which are unavoidable and usually unwanted capacitance that exists between the parts of an electronic component or circuit simply because of their proximity to each other. For a given form factor, parasitics are created out of the already existing ground without needing new structures needed. For cost efficiency and size, it is not desired to introduce new structures, parts. It would be advantageous to utilize existing parasitics to improve operation such as to increase bandwidth to account for the tolerances, etc.

BRIEF SUMMARY OF THE DISCLOSURE

In an embodiment, a multi-antenna structure includes a monopole-like or loop-like antenna structure with an antenna feed configured to connect to electrical circuitry; and a slot-like antenna structure adjacent to the monopole-like or loop-like antenna structure and capacitively fed by the monopole-like or loop-like antenna structure, wherein the monopole-like or loop-like antenna structure and the slot-like antenna structure operate as a combined antenna with extended bandwidth relative to operation individually. The monopole-like or loop-like antenna structure can include a horizontal member and a plurality of vertical members connected to the horizontal member. A first vertical member can connect to the antenna feed and the first vertical member can be configured to capacitively feed the slot-like antenna structure. Each of the plurality of vertical members can have an associated foot for electrical mounting and mechanical support on a printed circuit board. The combined antenna operates at a first frequency, and wherein the monopole-like or loop-like antenna structure can further include an additional arm extending out from the horizontal member for operation at a second frequency such that the monopole-like or loop-like antenna structure has dual-band operation.

The slot-like antenna structure can include two parallel horizontal members separated by a slot and a vertical member at one end of the slot connected to each of the two parallel horizontal members separated and another end of the slot is open. The two parallel horizontal members and the vertical member can be formed in a heatsink. Two of the plurality of vertical members of the monopole-like or loop-like antenna structure can have terminations and can be spaced closely to one another to cancel corresponding electrical fields such that the monopole-like or loop-like antenna structure is not strongly coupled to the slot-like antenna structure near the another end of the slot. The monopole-like or loop-like antenna structure and the slot-like antenna structure are independently tunable.

In another embodiment, a multi-antenna system includes a first monopole-like or loop-like antenna structure with a first antenna feed configured to connect to electrical circuitry; a first slot-like antenna structure adjacent to the first monopole-like or loop-like antenna structure and capacitively fed by the first monopole-like or loop-like antenna structure, wherein the first monopole-like or loop-like antenna structure and the first slot-like antenna structure are a first combined antenna with extended bandwidth relative to operation individually; a second monopole-like or loop-like antenna structure with a second antenna feed configured to connect to the electrical circuitry; a second slot-like antenna structure adjacent to the second monopole-like or loop-like antenna structure and capacitively fed by the second monopole-like or loop-like antenna structure, wherein the second monopole-like or loop-like antenna structure and the second slot-like antenna structure are a second combined antenna with extended bandwidth relative to operation individually; and an isolation notch between the first slot-like antenna structure and the second slot-like antenna structure. The first combined antenna and second combined antenna can have associated components that are a mirror image of one another.

In a further embodiment, a wireless device includes electrical circuitry disposed on a printed circuit board; a heatsink configured to dissipate heat associated with the electrical circuitry; a monopole-like or loop-like antenna structure disposed on the printed circuit board and with an antenna feed configured to connect to the electrical circuitry; and a slot-like antenna structure formed in the heatsink and adjacent to the monopole-like or loop-like antenna structure and capacitively fed by the monopole-like or loop-like antenna structure, wherein the monopole-like or loop-like antenna structure and the slot-like antenna structure operate as a combined antenna with extended bandwidth relative to operation individually. The wireless device can be a wireless access point, and wherein the monopole-like or loop-like antenna structure supports dual-band operation.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to systems and methods for a multi-antenna structure with two radiating antennas where one antenna feeds another antenna. The multi-antenna structure can include two or more radiating antennas with one antenna that is a loop like or monopole like structure and a second antenna that is a slot-like structure, in which one of the antennas is fed from the other antenna. For example, the loop like or monopole like structure can feed the slot like structure. In particular, the slot-like structure can be formed from a heat sink where radiating parasitics with a common ground are mirrored around a notch choke and excited by loops. This multi-antenna structure can double to triple the frequency bandwidth of operation without adding additional parts, materials, or antenna feeds. Specifically, increased bandwidth is desired for enhanced performance, and for robustness against manufacturing tolerances that tend to shift resonances out of band of operation, especially in compact form-factors. The slot-like structure is created out of the already existing ground without new structures needed. The parasitics are mirrored around a choke notch allowing for $1/10$ of wavelength spacing between radiating parasitic elements. Advantageously, the multi-antenna structure takes existing components which are parasitics and uses them for operation in a positive manner.

Example Wireless Device

Figure 1:
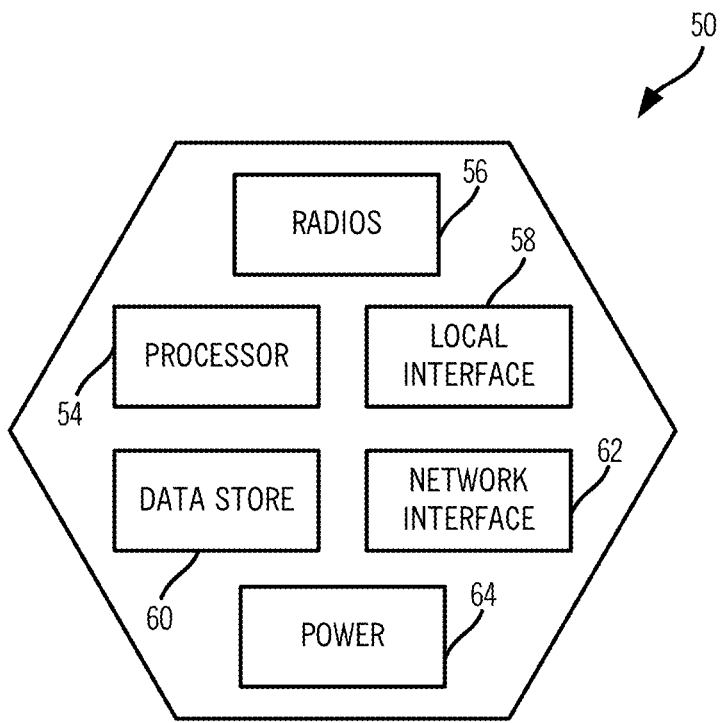
FIG. 1 is a block diagram of functional components of a wireless access point as an example wireless device implementing the systems and methods described herein.
Figure 2:
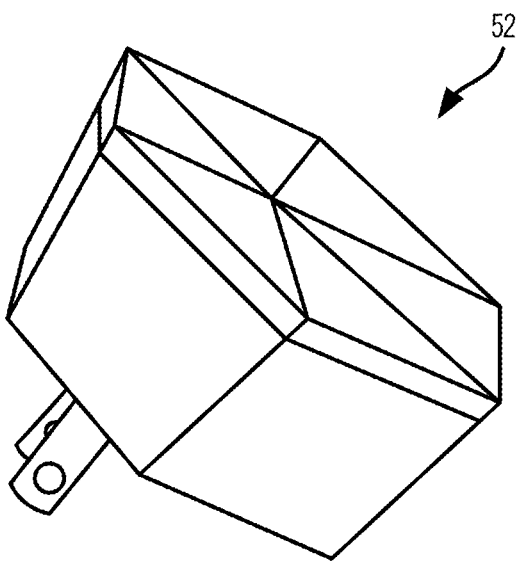
FIG. 2 is a perspective diagram of a physical form factor for the wireless access point of FIG. 1.

FIG. 1 is a block diagram of functional components of a wireless access point 50 as an example wireless device implementing the systems and methods described herein. FIG. 2 is a perspective diagram of a physical form factor 52 for the wireless access point 50. The access point 50 includes the physical form factor 50 which contains a processor 54, a plurality of radios 56, a local interface 58, a data store 60, a network interface 62, and power 64. It should be appreciated by those of ordinary skill in the art that FIG. 1 depicts the access point 50 in an oversimplified manner, and a practical embodiment may include additional components and suitably configured processing logic to support features described herein or known or conventional operating features that are not described in detail herein. Further, those of ordinary skill in the art will appreciate the wireless access point 50 is one example wireless device for the systems and methods, and other types of wireless devices are also contemplated with the multi-antenna structure described herein.

In an exemplary embodiment, the form factor 52 is a compact physical implementation where the access point 50 directly plugs into an electrical socket and is physically supported by the electrical plug connected to the electrical socket. This compact physical implementation is ideal for a large number of access points 50 distributed throughout a location. The processor 54 is a hardware device for executing software instructions. The processor 54 can be any custom made or commercially available processor, a Central Processing Unit (CPU), an auxiliary processor among several processors, a semiconductor-based microprocessor (in the form of a microchip or chip set), or generally any device for executing software instructions. When the access point 50 is in operation, the processor 54 is configured to execute software stored within memory or the data store 60, to communicate data to and from the memory or the data store 40, and to generally control operations of the access point 50 pursuant to the software instructions. In an exemplary embodiment, the processor 54 may include a mobile-optimized processor such as optimized for power consumption and mobile applications.

The radios 56 enable wireless communication. The radios 56 can operate according to the IEEE 802.11 standard and variants thereof. The radios 56 include address, control, and/or data connections to enable appropriate communications on a Wi-Fi system. As described herein, the access point 50 includes radios to support different links, i.e., backhaul links (to form Wi-Fi connectivity between access points) and client links (to form Wi-Fi connectivity between access points and clients). In an embodiment, the access point 50 can support dual-band operation simultaneously operating 2.4 GHz and 5 GHz 2×2/4×4 MIMO 802.11b/g/n/ac radios having operating bandwidths of 20/40 MHz for 2.4 GHz and 20/40/80 MHz for 5 GHz. For example, the access point 50 can support IEEE 802.11AC1200 gigabit Wi-Fi (300+867 Mbps). Also, the radios 56 can include a Bluetooth interface as well for local access, control, onboarding, etc.

The local interface 58 is configured for local communication to the access point 50 and can be either a wired connection or wireless connection such as Bluetooth or the like. Since the access point 50 can be configured via the cloud, an onboarding process is required to first establish connectivity for a newly turned on access point 50. In an exemplary embodiment, the access point 50 can also include the local interface 58 allowing connectivity to a user device for onboarding to a Wi-Fi system such as through an app on the user device. The data store 60 is used to store data. The data store 60 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 60 may incorporate electronic, magnetic, optical, and/or other types of storage media.

The network interface 62 provides wired connectivity to the access point 50. The network interface 62 may be used to enable the access point 50 to communicate to a modem/router. Also, the network interface 62 can be used to provide local connectivity to a user device. For example, wiring in a device to an access point 50 can provide network access to a device which does not support Wi-Fi. The network interface 62 may include, for example, an Ethernet card or adapter (e.g., 10BaseT, Fast Ethernet, Gigabit Ethernet, 10 GbE). The network interface 62 may include address, control, and/or data connections to enable appropriate communications on the network. The processor 54 and the data store 60 can include software and/or firmware which essentially controls the operation of the access point 50, data gathering and measurement control, data management, memory management, and communication and control interfaces with the cloud.

Multi-Antenna Structure Integrated into the Form Factor

Figure 3:
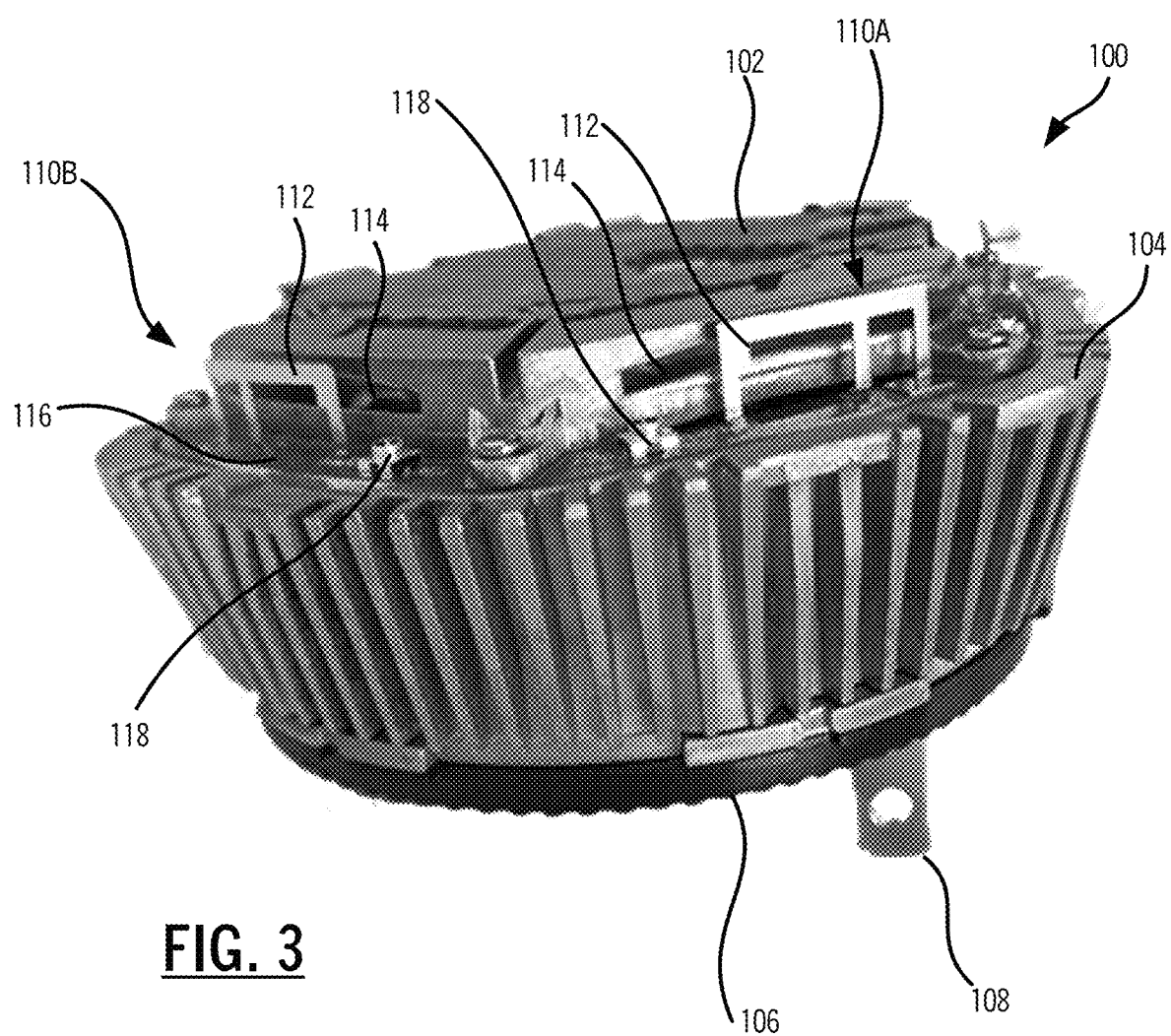
FIG. 3 is a side perspective view of a wireless device with a housing removed to illustrate mechanical metal parts, heat sinks, an RF board, loop/monopole-like antenna, and parasitic components forming a slot-like antenna.
Figure 4:
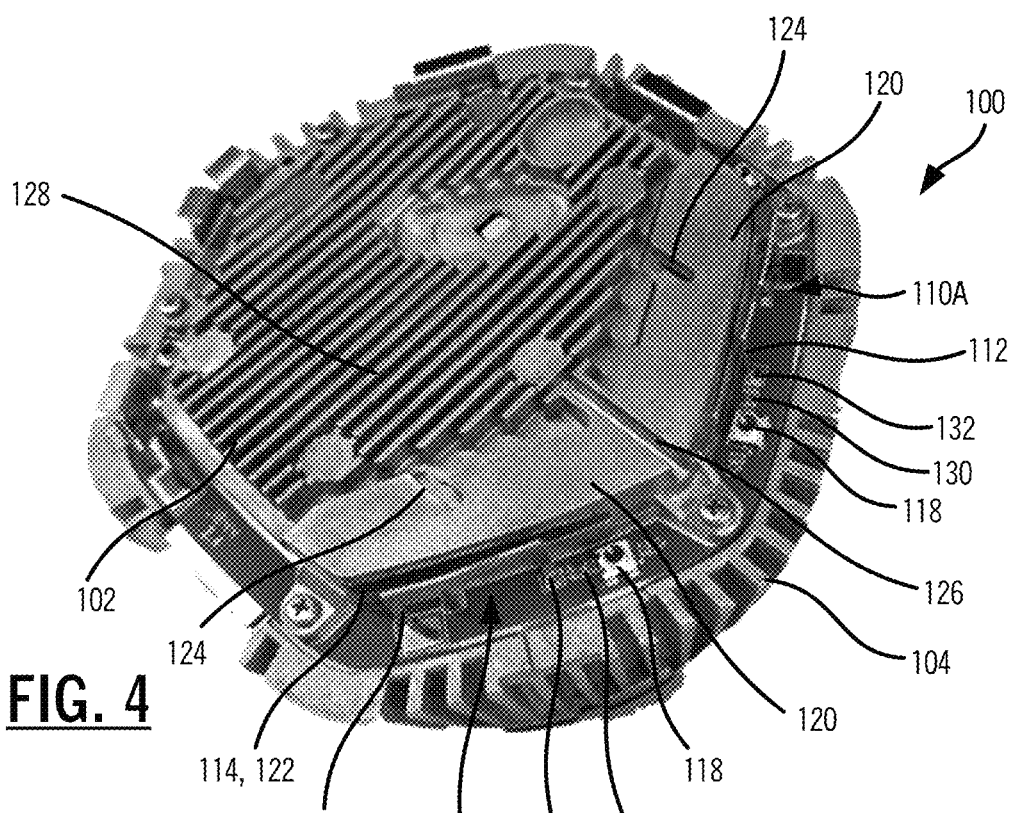
FIG. 4 is a top perspective view of the wireless device from FIG. 3.
Figure 5:
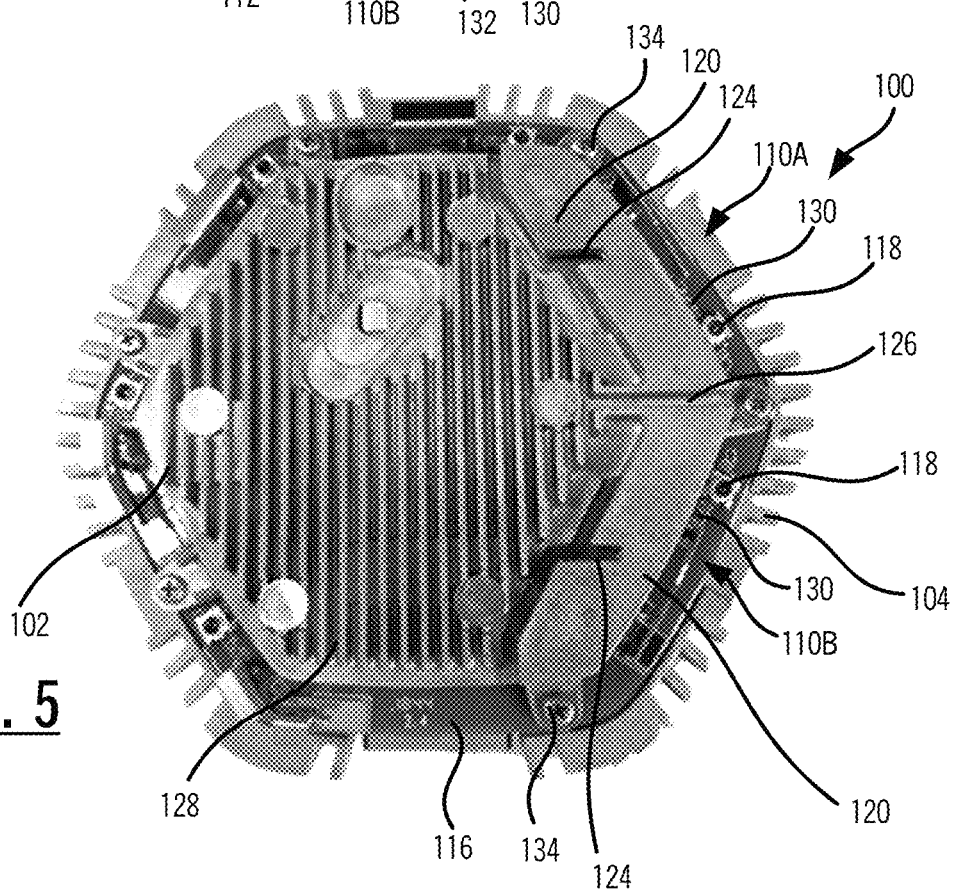
FIG. 5 is a top view of the wireless device from FIGS. 3-4.
Figure 6:
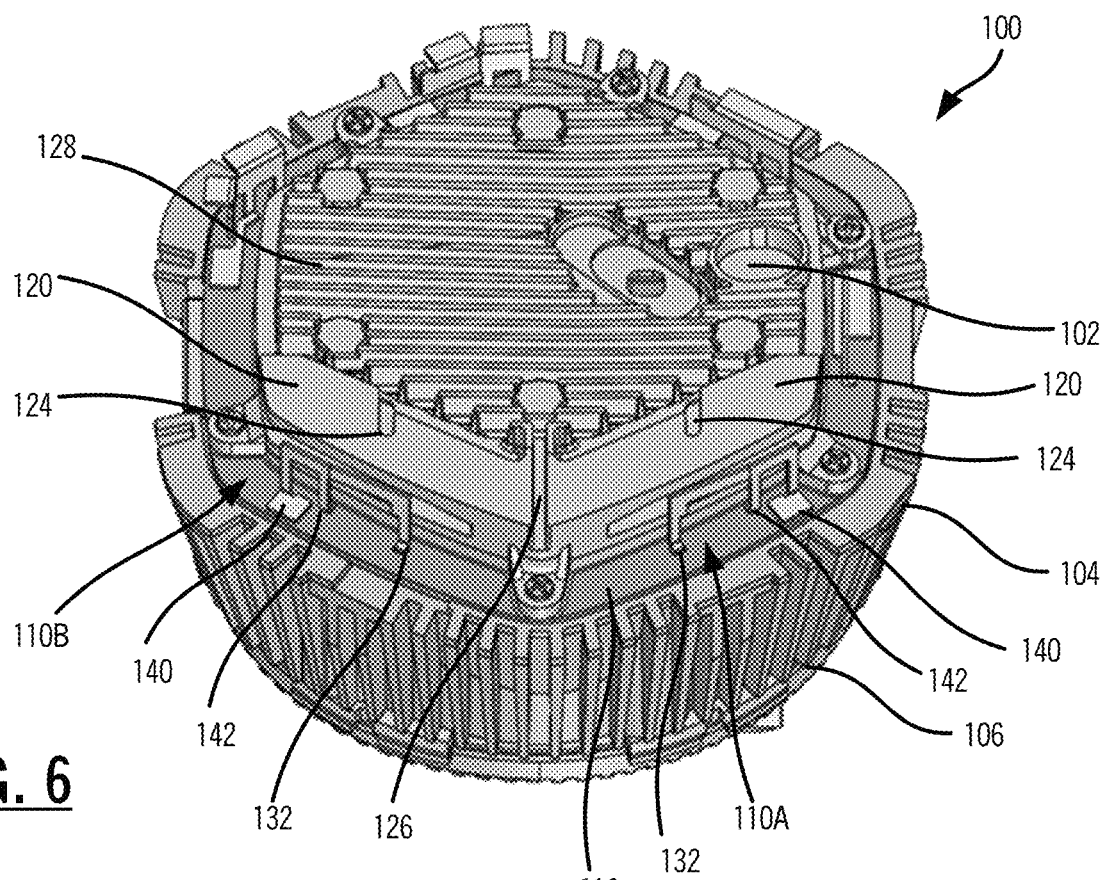
FIG. 6 is another perspective view of the wireless device from FIGS. 3-5.
Figure 7:
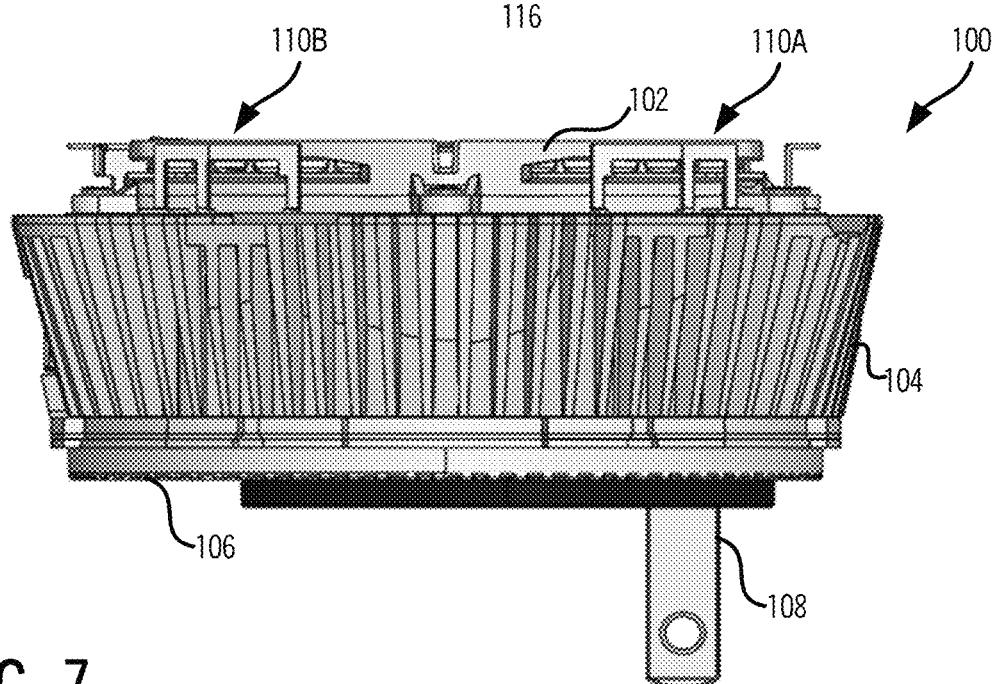
FIG. 7 is a side view of the wireless device from FIGS. 3-6.
Figure 8:
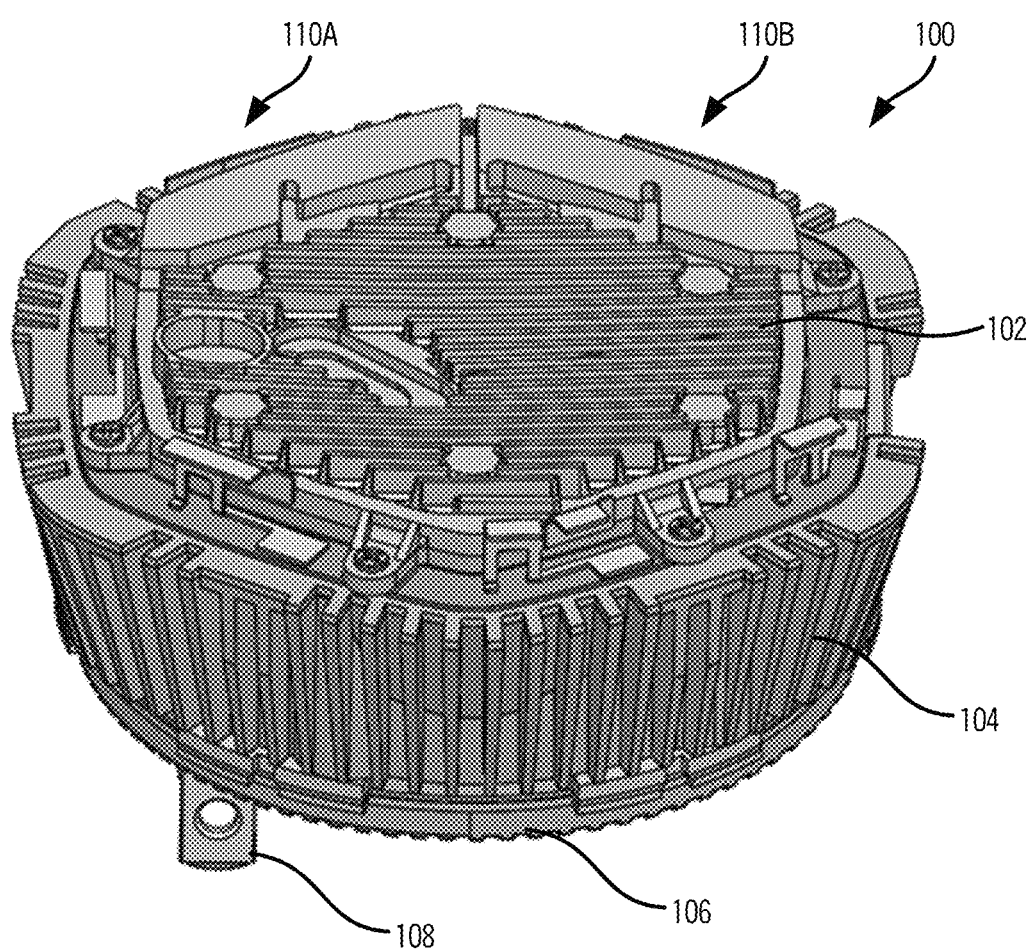
FIG. 8 is another side perspective view of the wireless device from FIGS. 3-7 illustrating an opposite side from FIG. 3.

FIG. 3 is a side perspective view of a wireless device 100 with a housing removed to illustrate mechanical metal parts, heat sinks, an RF board, loop/monopole-like antenna, and parasitic components forming a slot-like antenna. FIG. 4 is a top perspective view of the access point 50 from FIG. 3. FIG. 5 is a top view of the access point 50 from FIGS. 3-4. FIG. 6 is another perspective view of the access point 50 from FIGS. 3-5. FIG. 7 is a side view of the access point from FIGS. 3-6. FIG. 8 is another side perspective view of the access point 50 from FIGS. 3-7 illustrating an opposite side from FIG. 3. Again, in an embodiment, the wireless device 100 may include the access point 50.

The wireless device 100 includes a top heatsink 102, a mid-heatsink 104, and a bottom heatsink 106. In an embodiment, the wireless device 100 includes a plug 108 and is configured to directly plug into an electrical outlet. The heatsinks 102, 104, 106 encapsulate electrical circuitry (not shown) and provide heat dissipation. Of note, the wireless device 100 in an embodiment has a compact form factor and the heatsinks 102, 104, 106 can cause parasitics as it is difficult to separate antennas from the heatsinks 102, 104, 106 in the compact form factor.

The wireless device 100 is illustrated with two multi-antenna structures 110 (labeled 110A, 110B). Each multi-antenna structure 110 includes a monopole-like or loop-like antenna structure 112 that is adjacent to and feeds a slot-like antenna structure 114 that is formed in the top heatsink 102. There is a Printed Circuit Board (PCB) 116 between the top heatsink 102 and the mid heatsink 104. Further, there is an antenna feed 118 connected to the PCB 116 for feeding the monopole-like or loop-like antenna structure 112. The monopole-like or loop-like antenna structure 112, in turn, feeds the slot-like antenna structure 114 while also radiating as an antenna itself. The slot-like antenna structure 114 is formed out of the top heatsink 102 in a manner that utilizes the parasitics associated with metallic heatsinks to provide the slot-like antenna structure 114. Note, the monopole-like or loop-like antenna structure 112 and the slot-like antenna structure 114 utilize the term "like" to indicate these are practical implementations of antenna structures and not necessarily the ideal/theoretical slot or monopole antenna.

Specifically, for a heatsink, an important aspect for heat dissipation is the mass and not necessarily the structure. Accordingly, various notches, grooves, and the slot is formed in the top heatsink 102 to form the slot-like antenna structure 114. The top heatsink 102, for each of the slot-like antenna structures 114 in the multi-antenna structure 110A, 110B, includes a parasitic component 120 located above and extending adjacent from a slot 122 of the slot-like antenna structure 114. The parasitic component 120 of the top heatsink 102 is relatively flat with a notch 124 for tuning the parasitic component 120, and there is a notch 126 for isolating the parasitic components 120 of the separate multi-antenna structures 110A, 110B. Of course, the notch 126 is not required for a single multi-antenna structure 110. Of note, the top heatsink 102 includes fins 128 which are omitted in the parasitic component 120. That is, the design of the top heatsink 102 excludes the fins 128 in the parasitic component 120 such that the parasitic component 120 can be utilized in the slot-like antenna structure 114.

The antenna feed 118 on the PCB 116 is connected to electrical circuitry (not shown) that performs electrical functions associated with the operation of the multi-antenna structure 110. The antenna feed 118 is further connected to an antenna matching network 130 that is connected to an antenna feed point 132 of the monopole-like or loop-like antenna structure 112. Again, there is no corresponding antenna feed 118, an antenna matching network 130, and the antenna feed point 132 for the slot-like antenna structure 114. Rather, the slot-like antenna structure 114 is fed by the monopole-like or loop-like antenna structure 112 as further described herein. The parasitic component 120 can include screws 134 or other metallic connected to the PCB 116 for ground.

The monopole-like or loop-like antenna structure 112 can include the antenna feed point 132 on the PCB and terminations 140, 142 that can open, short, or matched. In an embodiment, the terminations 140, 142 are legs that are connected to the PCB 116, such as via soldering to copper pads that are electrically floating (not connected to ground). Note, the terminations 140, 142 as legs further operate to provide mechanical support for the monopole-like or loop-like antenna structure 112 on the PCB 116.

Figure 9:
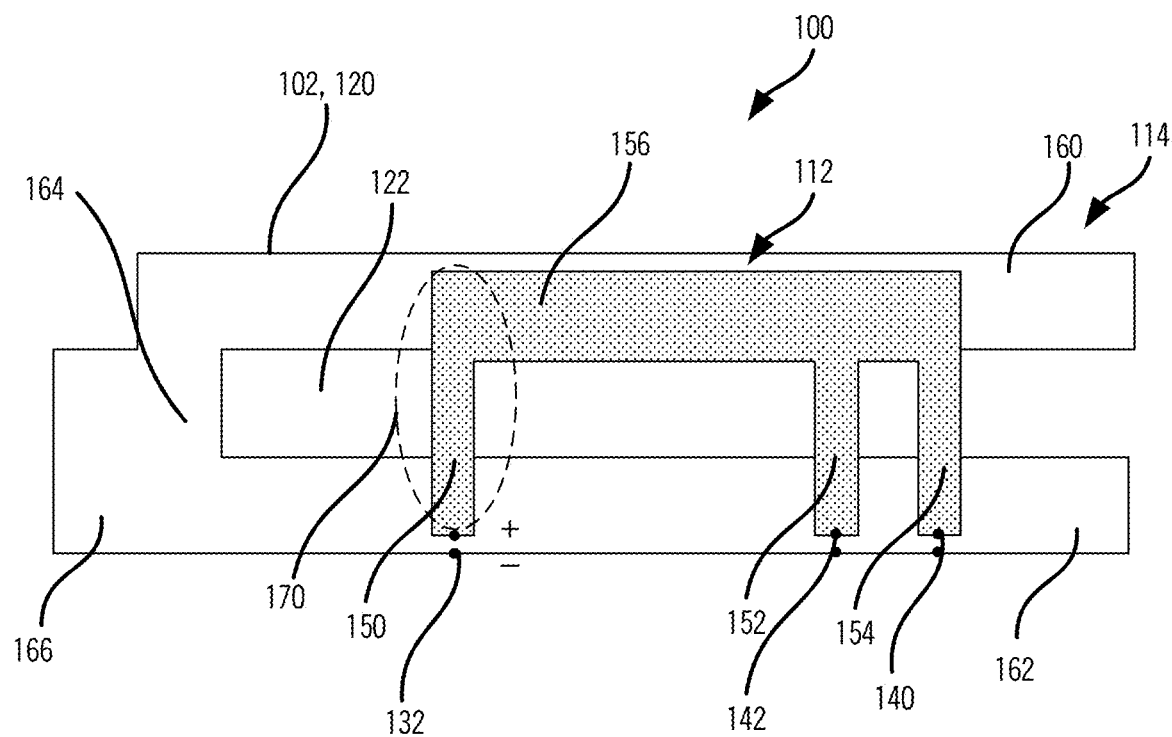
FIG. 9 is a side view of a multi-antenna structure.
Figure 10:
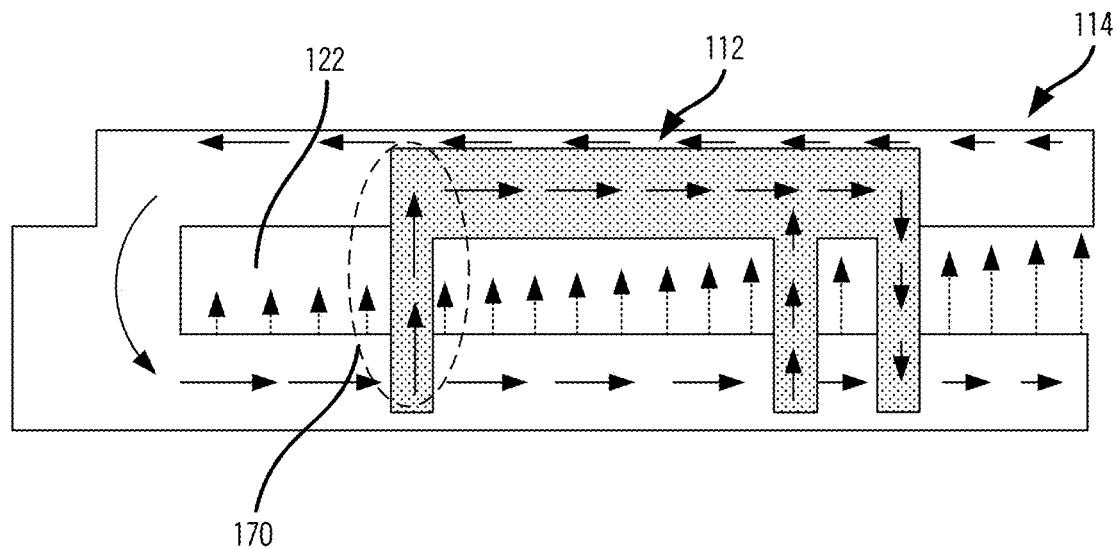
FIG. 10 is a side view of the multi-antenna structure of FIG. 9 illustrating current flow and electric field distribution.

FIG. 9 is a side view of the multi-antenna structure 110 and FIG. 10 is a side view of the multi-antenna structure 110 illustrating current flow and electric field distribution. The monopole-like or loop-like antenna structure 112 is in front of the slot-like antenna structure 114. Again, the slot-like antenna structure 114 is formed in the top heatsink 102 and the monopole-like or loop-like antenna structure 112 is on the PCB 116. The monopole-like or loop-like antenna structure 112 includes three vertical members 150, 152, 154 each connected to a horizontal member 156. Note, the terms "horizontal" and "vertical" are utilized for illustration purposes and in a practical embodiment in the wireless device 100, the members may have any orientation as long as the members 150, 152, 154 are perpendicular and connected to the member 156. The overall length of the members 150, 152, 154, 156 is based on a desired frequency of operation. In an example embodiment, the overall length of the members 150, 152, 154, 156 is about 45 mm for operation in the 2.4 GHz range, and the length of the horizontal member 156 is about 15 mm for operation in the 2.4 GHz range.

The slot-like antenna structure 114 includes two parallel horizontal members 160, 162 separated by the slot 122 and one vertical member 164 at one end connecting the two parallel horizontal members 160, 162. The slot 122 is open at the opposite end of the vertical member 164, and there is ground 166. The slot 122 has a gap size which is the distance between the two parallel horizontal members 160, 162 and a slot length which is the distance from the vertical member 164 to the open end. These distances are set based on a desired frequency of operation. For example, the gap size can be about 1.7 mm for operation in the 2.4 GHz range.

In FIG. 10, the arrows in the monopole-like or loop-like antenna structure 112 and the slot-like antenna structure 114 have an associated length indicative of the strength of the current and the direction showing the flow. The dashed arrows in the slot 122 have an associated length indicative of the strength and direction of electric field. Again, the multi-antenna structure 110 includes a single antenna feed point 132 on the monopole-like or loop-like antenna structure 112. The slot-like antenna structure 114 is capacitively fed at a location 170 that corresponds to the first vertical member 150 that is perpendicular to the slot 122 in the slot-like antenna structure 114. The electric field at the location 170 of the monopole-like or loop-like antenna structure 112 lines up and is parallel to the electric field of the slot-like antenna structure 114. The coupling between the horizontal member 150 and the parasitic component 120 used to form the slot-like antenna structure 114 is controlled by distance. For example, the distance can be about 1~2 mm.

The horizontal member 156 is parallel to the slot 122 and the electric field of the monopole-like or loop-like antenna structure 112 is not coupled strongly to the slot-like antenna structure 114. Accordingly, the monopole-like or loop-like antenna structure 112 can be tuned by increasing the length of the horizontal member 156 without disturbing the slot-like antenna structure 114 and without detuning the slot-like antenna structure 114. The slot-like antenna structure 114 can be tuned by increasing the slot length, and there is no coupling between the antenna structures 112, 114 at the open end of the slot-like antenna structure 114. Thus, the monopole-like or loop-like antenna structure 112 and the slot-like antenna structure 114 can be tuned independently.

The members 152, 154 are spaced closely such that the currents on the members 152, 154 generate canceling electric fields from the monopole-like or loop-like antenna structure 112 in this region. Note, the currents on members 152, 154 are in opposite directions which generate electrical fields in opposite directions which cancel. Accordingly, this portion of the monopole-like or loop-like antenna structure 112 is not strongly coupled to the slot-like antenna structure 114.

Figure 11:
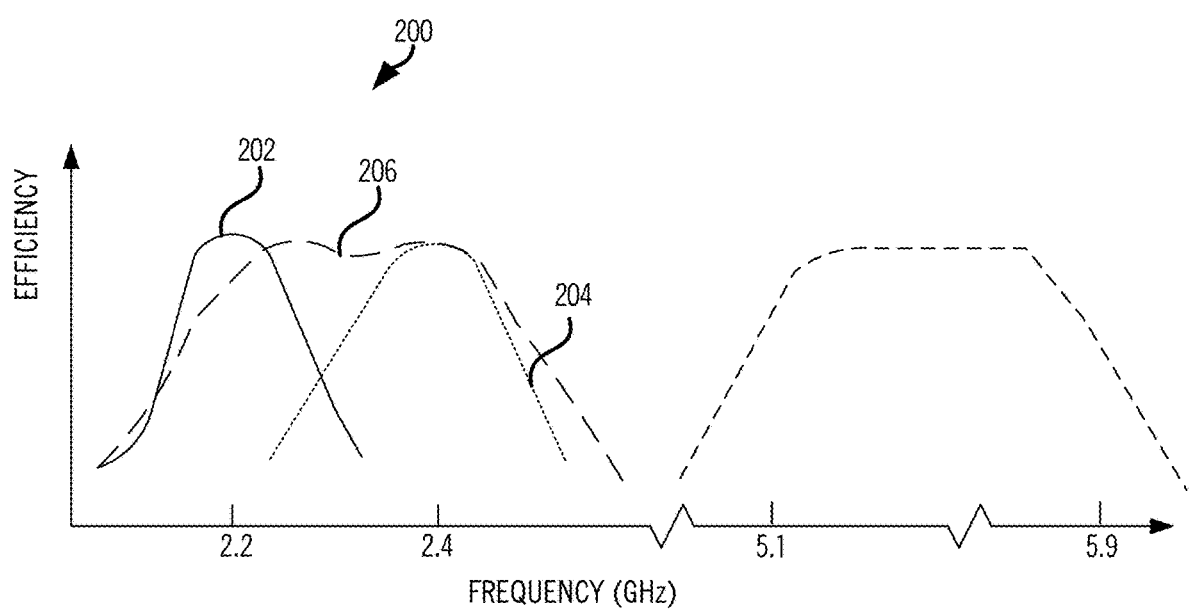
FIG. 11 is a graph of efficiency versus frequency for the multi-antenna structure of FIGS. 9-10.

The multi-antenna structure 110 can include two radiating resonances. In an embodiment, a first resonance can be near 2.2 GHz and dominated by the horizontal member 156 and tuned by it. A second resonance can be tuned by controlling the slot length of the slot 122 and dominated by the parasitic component 120. Combined, the first resonance and the second resonance can be used to broaden the bandwidth. FIG. 11 is a graph 200 of efficiency versus frequency for the multi-antenna structure 110. The graph 200 includes lines 202, 204, 206. The line 202 illustrates the monopole-like or loop-like antenna structure 112 by itself. The line 204 illustrates the slot-like antenna structure 114 by itself. Finally, the line 206 illustrates the multi-antenna structure 110 which is a combination of the monopole-like or loop-like antenna structure 112 and the slot-like antenna structure 114. Note, that by reusing the parasitic component 120 on the top heatsink 102, the multi-antenna structure 110 doubles/triples the bandwidth. This is important and useful in the compact form factor where tolerances are tight due to the small size.

Figure 12:
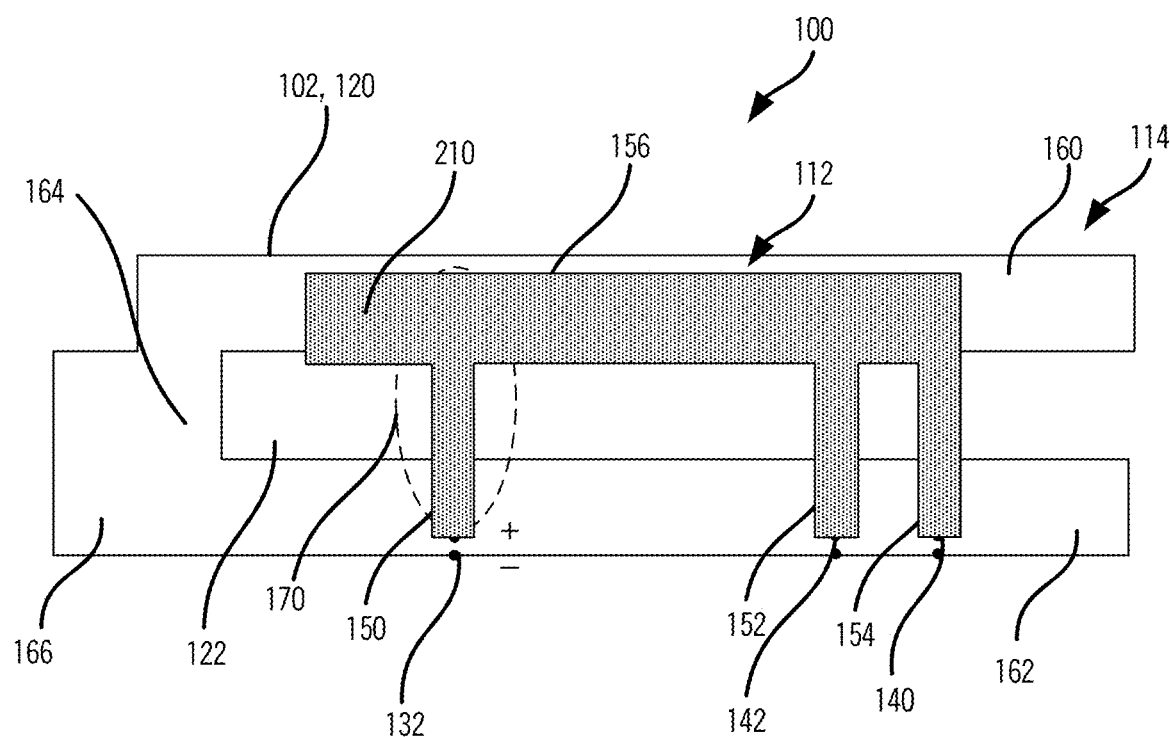
FIG. 12 is a side view of the multi-antenna structure of FIGS. 9-10 with an additional arm member for dual-band operation.

FIG. 12 is a side view of the multi-antenna structure 110 with an additional arm member 210 for dual-band operation. Specifically, the arm member 210 extends the horizontal member 156 from the vertical member 150 to support a resonance around 5 GHz for the monopole-like or loop-like antenna structure 112. Here, the combined monopole-like or loop-like antenna structure 112 and the slot-like antenna structure 114 support resonances at 2.4 GHz such as illustrated in the graph 200, and the monopole-like or loop-like antenna structure 112 by itself supports resonances at 5 GHz allowing the multi-antenna structure 110 to support dual-band operation (2.4 GHz/5 GHz). See the graph 200 in FIG. 11.

Of note, with two of the multi-antenna structures 110A, 110B in the wireless device 100, each of the structures 110A, 110B is a mirror of the other from an orientation perspective. That is, the associated components are a mirror image of one another. The notch 126 and the minoring provide a choke point for the coupling currents between the multi-antenna structures 110A, 110B. This is in spite of the close proximity of the multi-antenna structures 110A, 110B, e.g., the notch can be extremely narrow such as $\frac{1}{10}^{th}$ of the wavelength of interest.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A multi-antenna structure comprising:
   a monopole-like or loop-like antenna structure with an antenna feed configured to connect to electrical circuitry;
   a heatsink configured to dissipate heat associated with the electrical circuitry; and
   a slot-like antenna structure formed in the heatsink and adjacent to the monopole-like or loop-like antenna structure and capacitively fed by the monopole-like or loop-like antenna structure,
   wherein the monopole-like or loop-like antenna structure and the slot-like antenna structure operate as a combined antenna with extended bandwidth relative to operation individually.

2. The multi-antenna structure of claim 1, wherein the monopole-like or loop-like antenna structure includes a horizontal member and a plurality of vertical members connected to the horizontal member.

3. The multi-antenna structure of claim 2, wherein a first vertical member connects to the antenna feed and the first vertical member is configured to capacitively feed the slot-like antenna structure.

4. The multi-antenna structure of claim 2, wherein each of the plurality of vertical members has an associated foot for electrical mounting and mechanical support on a printed circuit board.

5. The multi-antenna structure of claim 2, wherein the combined antenna operates at a first frequency, and wherein the monopole-like or loop-like antenna structure further includes an additional arm extending out from the horizontal member for operation at a second frequency such that the monopole-like or loop-like antenna structure has dual-band operation.

6. The multi-antenna structure of claim 2, wherein the slot-like antenna structure includes two parallel horizontal members separated by a slot and a vertical member at one end of the slot connected to each of the two parallel horizontal members separated and another end of the slot is open.

7. The multi-antenna structure of claim 6, wherein the two parallel horizontal members and the vertical member are formed in the heatsink.

8. The multi-antenna structure of claim 6, wherein two of the plurality of vertical members of the monopole-like or loop-like antenna structure have terminations and are spaced closely to one another to cancel corresponding electrical fields such that the monopole-like or loop-like antenna structure is not strongly coupled to the slot-like antenna structure near the another end of the slot.

9. The multi-antenna structure of claim 6, wherein the monopole-like or loop-like antenna structure and the slot-like antenna structure are independently tunable.

10. A multi-antenna system comprising:
    a first monopole-like or loop-like antenna structure with a first antenna feed configured to connect to electrical circuitry;
    a heatsink configured to dissipate heat associated with the electrical circuitry;

a first slot-like antenna structure formed in the heatsink and adjacent to the first monopole-like or loop-like antenna structure and capacitively fed by the first monopole-like or loop-like antenna structure, wherein the first monopole-like or loop-like antenna structure and the first slot-like antenna structure are a first combined antenna with extended bandwidth relative to operation individually;

a second monopole-like or loop-like antenna structure with a second antenna feed configured to connect to the electrical circuitry;

a second slot-like antenna structure formed in the heatsink and adjacent to the second monopole-like or loop-like antenna structure and capacitively fed by the second monopole-like or loop-like antenna structure, wherein the second monopole-like or loop-like antenna structure and the second slot-like antenna structure are a second combined antenna with extended bandwidth relative to operation individually; and an isolation notch between the first slot-like antenna structure and the second slot-like antenna structure.

11. The multi-antenna system of claim 10, wherein the first combined antenna and second combined antenna have associated components that are a mirror image of one another.

12. The multi-antenna system of claim 10, wherein the first monopole-like or loop-like antenna structure and the second monopole-like or loop-like antenna structure each include a horizontal member and a plurality of vertical members connected to the horizontal member.

13. The multi-antenna system of claim 12, wherein a first vertical member connects to the corresponding antenna feed and the first vertical member is configured to capacitively feed the corresponding slot-like antenna structure.

14. The multi-antenna system of claim 12, wherein each of the plurality of vertical members has an associated foot for electrical mounting and mechanical support on a printed circuit board.

15. The multi-antenna system of claim 12, wherein each of the first combined antenna and second combined antenna operate at a first frequency, and wherein each of the first monopole-like or loop-like antenna structure and the second monopole-like or loop-like antenna structure further includes an additional arm extending out from the horizontal member for operation at a second frequency for dual-band operation.

16. The multi-antenna system of claim 12, wherein each of the first slot-like antenna structure and the second slot-like antenna structure includes two parallel horizontal members separated by a slot and a vertical member at one end of the slot connected to each of the two parallel horizontal members separated and another end of the slot is open.

17. The multi-antenna system of claim 16, wherein the two parallel horizontal members and the vertical member are formed in the heatsink.

18. The multi-antenna system of claim 16, wherein two of the plurality of vertical members of the first monopole-like or loop-like antenna structure and the second monopole-like or loop-like antenna structure have terminations and are spaced closely to one another to cancel corresponding electrical fields such that the corresponding monopole-like or loop-like antenna structure is not strongly coupled to the corresponding slot-like antenna structure near the another end of the slot.

19. A wireless device comprising:
electrical circuitry disposed on a printed circuit board;
a heatsink configured to dissipate heat associated with the electrical circuitry;
a monopole-like or loop-like antenna structure disposed on the printed circuit board and with an antenna feed configured to connect to the electrical circuitry; and
a slot-like antenna structure formed in the heatsink and adjacent to the monopole-like or loop-like antenna structure and capacitively fed by the monopole-like or loop-like antenna structure,
wherein the monopole-like or loop-like antenna structure and the slot-like antenna structure operate as a combined antenna with extended bandwidth relative to operation individually.

20. The wireless device of claim 19, wherein the wireless device is a wireless access point, and wherein the monopole-like or loop-like antenna structure supports dual-band operation.

\* \* \* \* \*